(12) United States Patent  
Gao et al.

(10) Patent No.: US 8,664,975 B1
(45) Date of Patent: Mar. 4, 2014

(54) SYSTEMS AND METHODS FOR FLEXIBLY CONFIGURING A PROGRAMMABLE LOGIC DEVICE

(75) Inventors: Yi Gao, Sunnyvale, CA (US); Renxin Xia, Saratoga, CA (US); Juin-Yeu Lu, Campbell, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/085,679

(22) Filed: Apr. 13, 2011

(51) Int. Cl.
*G06F 7/38* (2006.01)

(52) U.S. Cl.
USPC .......................................................... 326/38

(58) Field of Classification Search
USPC ............................................ 326/37–47, 101
See application file for complete search history.

(56) References Cited

U.S. PATENT DOCUMENTS

| 7,518,396 B1 | 4/2009 | Kondapalli et al. | |
| 2005/0278680 A1* | 12/2005 | Mukherjee et al. | 716/16 |
| 2010/0039137 A1* | 2/2010 | Okyay et al. | 326/38 |

OTHER PUBLICATIONS

"Altera Transceiver PHY IP Core" User Guide, Dec. 2010, Altera Corporation, 120 pages.

* cited by examiner

*Primary Examiner* — Thienvu Tran
(74) *Attorney, Agent, or Firm* — Weaver Austin Villeneuve & Sampson LLP (57) ABSTRACT

Systems and methods for flexibly configuring one or more intellectual property (IP) blocks of a programmable logic device are described. The methods include configuring and operating a first portion of the programmable logic device before configuring a remaining portion of the programmable logic device. By operating the first portion before configuring the remaining portions, various timing constraints including power-up timing constraints can be met by the programmable logic device.

20 Claims, 5 Drawing Sheets

SYSTEMS AND METHODS FOR FLEXIBLY CONFIGURING A PROGRAMMABLE LOGIC DEVICE

FIELD OF THE INVENTION

The present disclosure generally relates to systems and methods for flexibly configuring a programmable logic device.

BACKGROUND

A programmable logic device (PLD), such as a Field Programmable Gate Array (FPGA), is an integrated circuit that may be programmed to perform specified logic functions. The PLD typically includes an array of programmable logic blocks that may be programmed with an intellectual property (IP) core. It is appreciated that the IP core may be proprietary configuration data for a variety of commonly-used functions. The IP core may be vendor-provided and may be sold either by a manufacturer of the PLD or by a third party, freeing a customer of the manufacturer from programming the functions on its own.

The IP core can include a predetermined set of configuration data bits that program the PLD to perform one or more functions. Logic and connectivity of a design in the PLD can be represented by or be mapped by the IP core. The IP core can provide, but are not limited to providing, Digital Signal Processing (DSP) functions, storage function, logic functions, and math functions.

The PLD is typically configured using a dedicated control block in a rigid and sequential manner. A configuration stage completes before the PLD can be used. However, having a rigid configuration sequence limits and constrains use of the PLD in a variety of applications. Consequently, it is desirable to provide improved mechanisms for configuring the PLD.

SUMMARY OF THE INVENTION

Systems and methods for flexibly configuring one or more portions of a programmable logic device are described. Different portions of the programmable logic device can complete configuration and enter user mode independently while meeting specified timing constraints. The configuration order can be controlled by a programmable sequencer and any portion, once configured, can drive configuration of subsequent portions. The timing constraints can be satisfied by flexibly configuring programmable logic device portions.

BRIEF DESCRIPTION OF THE DRAWINGS

Various embodiments of the present invention may best be understood by reference to the following description taken in conjunction with the accompanying drawings, which illustrate specific embodiments of the present systems and methods.

DETAILED DESCRIPTION

A field programmable gate array (FPGA) may have a separate configuration stage and a user mode. During the configuration stage, all portions of the FPGA may be configured in a fixed frame sequence, such as a left-to-right sequence. For example, a left portion of the FPGA situated to the left of a right portion of the FPGA may be configured before configuring the left portion. All portions of the FPGA are configured before the FPGA can enter the user mode. Typically, a portion of the FPGA is held in a freeze state until all the portions of the FPGA are configured. However, as FPGAs grow in size and complexity, a length of time used before the FPGA can enter the user mode makes it difficult to meet many power-up timing constraints.

Systems and methods for flexibly configuring a programmable logic device (PLD) provide flexibility in configuring and operating multiple portions of the PLD. For example, a first portion of the PLD may be allowed to operate before the entire PLD is configured. The flexibility in configuring and operating the multiple portions allows a user to satisfy the power-up timing constraints.

Although the systems and methods of various embodiments of the present invention may be described in the context of PLDs, it should be recognized that various systems and methods can apply to system on programmable chips (SOPCs), complex PLDs (CPLDs), and other integrated circuit devices.

Figure 1:
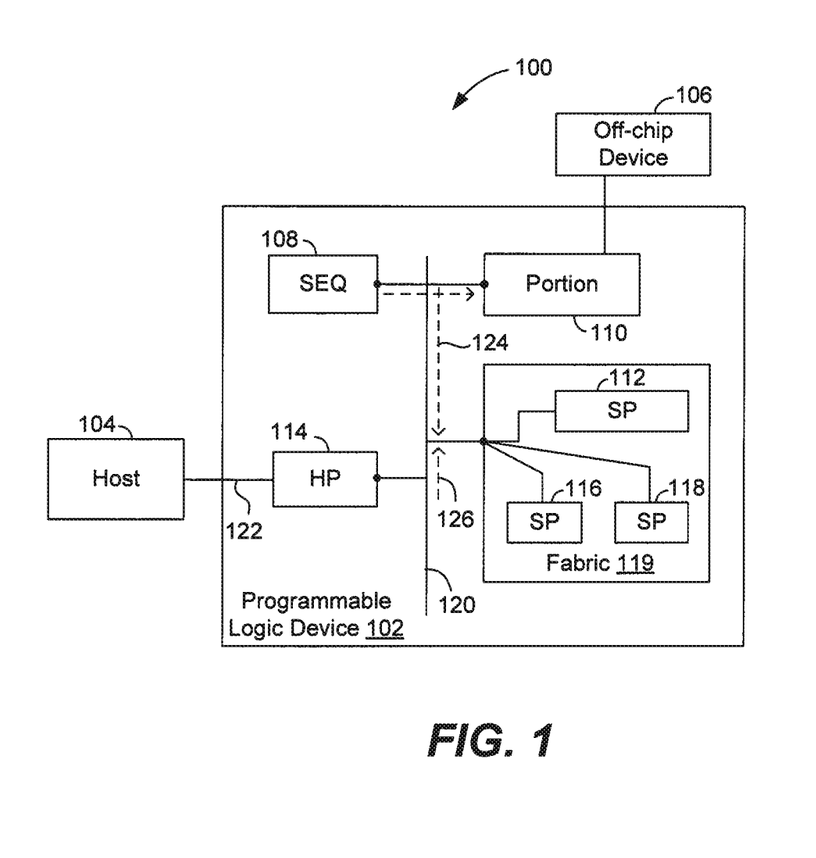
FIG. 1 is an exemplary block diagram of system including a programmable logic device in accordance with one embodiment of the present invention.

Referring now to FIG. 1, a system 100, in accordance with one embodiment of the present invention, is illustrated. System 100 includes a PLD 102, a host 104, and an off-chip device 106. PLD 102 may be an FPGA, an ASIC, a custom ASIC, etc. Host 104 may be a computer or a processor. Off-chip device 106 may be a computer, a processor, or a memory.

PLD 102 includes a sequencer 108, which may be a programmable master. Sequencer 108 may be a processor, a microprocessor, or a central processing unit (CPU), that stores one or more logical sequences for configuring portions 110, 112, 114, 116, and 118 of PLD 102. For example, sequencer 108 stores a logical sequence for configuring portion 110 before configuring portions 112, 114, 116, and 118. Sequencer 108 may also store configuration data for configuring portion 110. Portion 110 may be a processor, a central processing unit (CPU), or a microprocessor.

A portion of PLD 102 may be a soft or a hard portion. For example, portions 112, 116, and 118 may be soft portions, and sequencer 108 and portion 114 may be hard portions. Soft portions 112, 116, and 118 may be located within a soft fabric 119. Soft portion 112 may be a physical media attachment (PMA) offset cancelation module or a memory module. The memory module of soft portion 112 may be a random access memory (RAM) or multiple registers used to store calibration data used to calibrate the hard portion 114. Soft portion 116 may be a first chain of input/output (IO) configuration shift registers (IOCSRs) and soft portion 118 may be a second chain of IOCSRs. As another example, soft portion 116 may be a first portion of a chain of IOCSRs and soft portion 118 may a second portion of the chain.

It is appreciated that a hard portion of PLD 102 may be configured by waking up the hard portion from a sleep mode with a wake up signal. Accordingly, a wake up signal is an example of configuration data used to configure a hard portion. One or more parameters of a hard portion can be calibrated at a time the hard portion is implemented within PLD 102 for use in a field of application. A functionality of a hard portion may be defined using the one or more parameters. For example, the parameters may include a frequency of operation of a hard portion, a data width used to transfer data to and from the hard portion, a memory space within the hard portion, etc. The field of application may be an application of PLD 102 within a radar system, a video gaming system, or a server-based system.

Hard portion 114 may be a transceiver. The transceiver may include an interface that communicates with configuration bus 120 by using a protocol compatible with configuration bus 120 and may include another interface that communicates with host 104 via a link 122. The link 122 may follow a standard, such as a Peripheral Component Interface-Express (PCI-e) standard, a PCI standard, a 2.5 Gigabit standard, a 5 Gigabit standard, or an 8 Gigabit standard.

Communication between sequencer 108, portion 110, portion 112, portion 114, portion 116, and portion 118 is facilitated via a configuration bus 120. The configuration bus 120 facilitates communication of a wake up signal or configuration data by using a configuration protocol, such as an Advanced Micro Bus Architecture (AMBA) protocol. The AMBA protocol may be an advanced eXtensible interface (AXI) protocol, an advanced high-performance bus (AHB) protocol, an advanced system bus protocol (ASB) protocol, an advanced peripheral bus protocol (APB), or an advanced trace bus protocol (ATB).

The one or more logical sequences may be received by sequencer 108 from host 104. For example, the host 104 may determine that an operation of portion 110 is more time critical than an operation of any other portion of PLD 102 and sends a sequence indicating to sequencer 108 to configure or wake up portion 110 before configuring or waking up any other portion of PLD 102. It is noted that the time criticality may be measured in terms of a chance of satisfying the power-up timing constraints. For example, a determination that a configuration of portion 110 is more critical to timing involves a determination that configuring portion 110 first before configuring remaining portions 112, 114, 116, and 118 of PLD 102 will help satisfy the power-up timing constraints. The power up timing constraints may include a time period of configuration of PLD 102 from a time of power-up of host 104. Examples of the time period include 50 milliseconds (ms) and 100 ms.

The one or more logical sequences may not follow a physical order of configuring the remaining portions 112, 114, 116, and 118 of PLD 102. In various embodiments, the physical order may be the left-to-right sequence in which a portion of PLD 102 to the left of another portion of PLD 102 is configured before the other portion. Each portion 110, 112, 114, 116, and 118 may include one or more logic array blocks (LABs), one or more logic elements (LEs), one or more components of the LEs, a portion of one or more row interconnects, a portion of one or more column interconnects, and a portion of one or more switching circuits. The LABs, the LEs, row interconnects, column interconnects, components, and switching circuits are described below.

Figure 2:
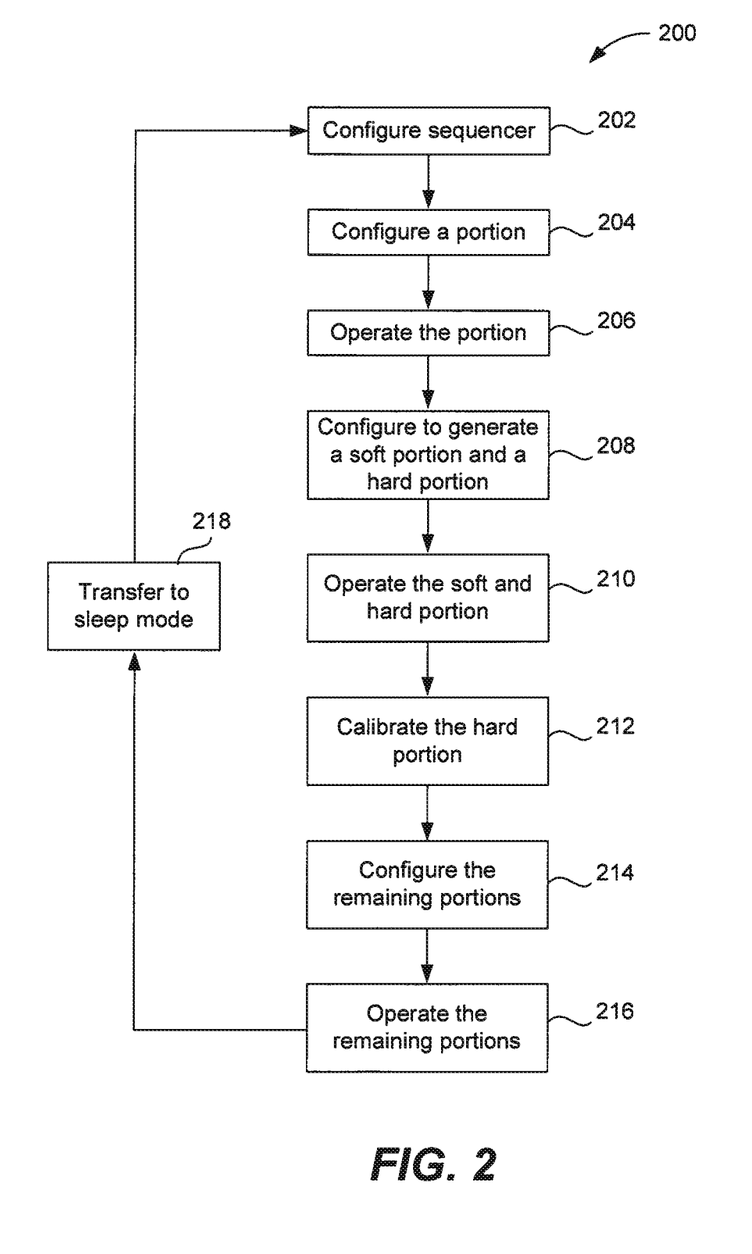
FIG. 2 is an exemplary flowchart of a method for flexibly configuring the programmable logic device in accordance with one embodiment of the present invention.

Referring to FIG. 2, at power-up of PLD 102, a method 200 executed to configure sequencer 108 and portions 110, 112, 114, 116, and 118 of PLD 102 is described in accordance with one embodiment of the present invention. Sequencer 108 may be configured 202 by being awaken from the sleep mode when PLD 102 is powered up or receives power higher than that received during the sleep mode. It is appreciated that the PLD 102 may remain awake until the PLD 102 is powered down.

Sequencer 108 configures 204 portion 110 via configuration bus 120. For example, sequencer 108, may send a wake up signal via the configuration bus 120 to portion 110. The wake up signal causes the portion 110 to receive power higher than the power received during the sleep mode.

Portion 110 becomes operational 206 upon being configured 204. For example, portion 110 may execute a boot-up sequence associated with an operating system if the portion 110 is a CPU. As another example, portion 110 may process digital signals if the portion 110 is a digital processor. As yet another example, portion 110 may convert parallel data to serial data if the portion 110 is a parallel-to-serial converter.

The portion 110 may access configuration data stored in the off-chip device 106 in order to configure soft portion 112 and hard portion 114 before configuring remaining soft portions 116 and 118 of PLD 102. It is appreciated that a command to configure the soft portion 112 and the hard portion 114 may be received from the sequencer 108 by portion 110.

Portion 110 configures 208 soft portion 112 and hard portion 114 by sending configuration data in a first direction 124 to soft portion 112 and by sending a wake up signal in the first direction 124 to hard portion 114. Upon being configured 208, the soft portion 112 and hard portion 114 may start operating 210. For example, the soft portion 112 may perform an arithmetic operation if the soft portion 112 is an adder. As another example, the hard portion 114 may select an output signal from two or more input signals if the hard portion 114 is a multiplexer.

Soft portion 112 may communicate the calibration data to hard portion 114 to calibrate 212 the hard portion 114. It is noted that sending the calibration data may be a part of operation 210 of soft portion 112. The operation 210 of soft portion 112 before configuring the remaining portions 114, 116, and 118 may allow PLD 102 to meet the power-up timing constraints of the standard by finishing calibration of the hard portion 114 before the power-up timing constraints may be violated.

Hard portion 114 may be calibrated 212 with the calibration data to receive configuration data from host 104 via link 122 and a time period of the reception of the configuration data may meet the power-up timing constraints. For example, upon calibration 212, hard portion 114 may be able to receive configuration data from host 104 within a time period of the power-up timing constraints of the PCI-e standard.

Upon calibration 212, the hard portion 114 may be able to access configuration data from host 104 via the link 122 and the configuration data may be used to configure 214 the remaining soft portions 116 and 118. The access of configuration data is an example of an operation of hard portion 114. In addition, the hard portion 114 may also access, from host 104 via link 122, a sequence of configuring the remaining soft portions 116 and 118 of the PLD 102.

Hard portion 114 may send configuration data in a second direction 126 to configure the soft portions 116 and 118. Upon configuration of soft portions 116 and 118, the entire PLD 102 is configured. Configuration bus 120 may facilitate communication in the second direction 126, which is opposite to the first direction 124.

The soft portions 116 and 118 start operating 216 upon configuration. For example, soft portion 116 operates by storing a bit if the soft portion 116 is a register. As another example, soft portion 118 may store data that may or may not be configuration data if the soft portion 118 is a RAM.

Sequencer 108 may thereafter transfer 218 into the sleep mode and the method 200 repeats. In some embodiments, sequencer 108 may transfer into the sleep mode in response to a power down of PLD 102 or a malfunction of a system, such as the radar system, the server-based system, or the gaming system.

In various embodiments, instead of configuring 214 the soft portions 116 and 118, hard portion 114 may configure one or more hard portions or a combination of hard and soft portions to configure the entire PLD 102.

In some embodiments, hard portion 114 may configure soft portion 116 by sending configuration data received from host 104 to the soft portion 116. The soft portion 116 starts to operate upon receiving the configuration data and the hard portion 114 thereafter sends configuration data received from host 104 to soft portion 118 to configure the soft portion 118, which may then start to operate. Moreover, the configuration of the soft portion 116 before soft portion 118 may be performed to follow a sequence received by hard portion 114 from portion 110 or from host 104.

In various embodiments, hard portion 114 may not be calibrated 212 separately after being configured 208. Rather, the hard portion 114 may be calibrated 212 simultaneously with configuration 208 of soft portion 112.

In some embodiments, portion 110 may configure soft portion 112 and hard portion 114 in any sequence. For example, portion 110 may configure soft portion 112 after configuring hard portion 114 or configure hard portion 114 after configuring soft portion 112.

In various embodiments, portion 110 may send a sequence of configuring the remaining portions 116 and 118 to hard portion 114 and/or soft portion 112.

In some embodiments, instead of configuring soft portion 112 and hard portion 114, portion 110 may configure two or more hard portions of PLD 102. In one embodiment, instead of configuring soft portion 112 and hard portion 114, portion 110 may configure two or more soft portions of PLD 102.

In various embodiments, when PLD 102 is used in a first field of application, portion 110 may not be configured. Rather, sequencer 108 may configure soft portion 112 that further configures hard portion 114. The hard portion 114 then configures the remaining soft portions 116 and 118. The first field of application may follow a standard that specifies configuring portions 112, 114, 116, and 118 faster than an amount of time taken for configuring portions 110, 112, 114, 116, and 118. The portions 110, 112, 114, 116, and 118 are configured as explained before when PLD 102 is implemented in a second field of application. The second field of application is different from the first field of application. Sequencer 108 may determine whether PLD 102 is to be used for the first or second field of application. In various embodiments, sequencer 108 may receive the determination of whether PLD 102 is to be used for the first or second field of application from host 104.

In some embodiments, during a first iteration of execution of method 200, host 104 may determine that a configuration of a first portion of the PLD 102 is more critical to timing than a configuration of the remaining portion of the PLD 102. In these embodiments, during the first iteration, the first portion is configured and operated before configuring the remaining portion. Moreover, in these embodiments, during a second iteration of execution of method 200, host 104 may determine that a configuration of the remaining portion is more critical to timing than a configuration of the first portion. In these embodiments, during the second iteration, the remaining portion is configured and operated before configuring the first portion. The second iteration follows the first iteration. For example, the first iteration may precede the second iteration.

In one embodiment, hard portion 114 may configure soft portion 116 and not configure soft portion 118 to configure the remaining portion of PLD 102. Also, host 104 may make a determination to not provide configuration data used for configuring soft portion 118 to hard portion 114.

It is noted that a portion of PLD 102 is configured in the configuration stage and the portion operates in the user mode.

Figure 3:
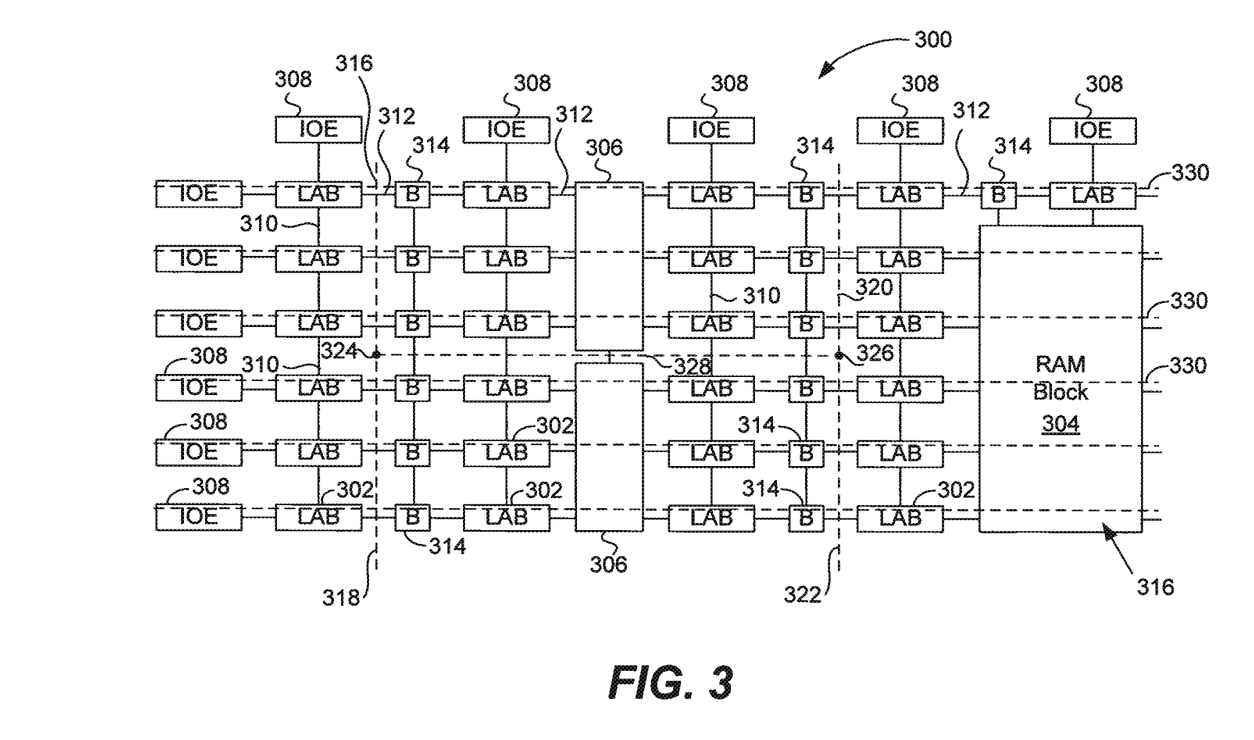
FIG. 3 is an exemplary block diagram of a programmable logic device in accordance with one embodiment of the present invention.

Referring to FIG. 3, a PLD 300 may include a two-dimensional array of programmable logic array blocks (LABs) 302 that may be interconnected via a network of multiple column interconnects 310 and multiple row interconnects 312 of varying length and speed. PLD 300 may be an example of PLD 102. LABs 302 may include multiple logic elements (LEs) (not shown) and each LE may include one or more registers (not shown). PLD 300 may also include a distributed memory structure including multiple RAM blocks of varying sizes provided throughout the PLD 300. The RAM blocks may include, for example, a MegaRAM block 304. PLD 300 may further include a set of digital signal processing (DSP) blocks 306 that can implement, for example, multipliers, add features, and/or subtract features. A set of IO elements (IOEs) 308 located around a periphery of the PLD 300 may support numerous single-ended and differential IO. PLD 300 may further include a set of buffers (Bs) 314 that connect LABs 302. Buffers 314 may be used to store data that is transferred between LABs 302.

A clock tree 316 may be overlaid on PLD 300. Clock tree 316 is shown in dashed lines. Clock tree 316 may include a set of clock spine paths 316, 318, 320, and 322. Spines 316 and 318 may be coupled at a point 324. Spines 320 and 322 may be coupled at a point 326. A clock path 328 may be used to couple spines 316 and 318 with spines 320 and 322. Row clock lines 330 may be connected at various points to spines 316, 318, 320, and 322. A clock signal may be applied via clock tree 316 to one or more LEs of PLD 300 or the components of the LEs. The components may include logic gates, multiplexers, registers, memory cells, and/or arithmetic units.

In some embodiments, PLD 300 may not include MegaRAM block 304, buffers 314, or DSP blocks 306.

Figure 4:
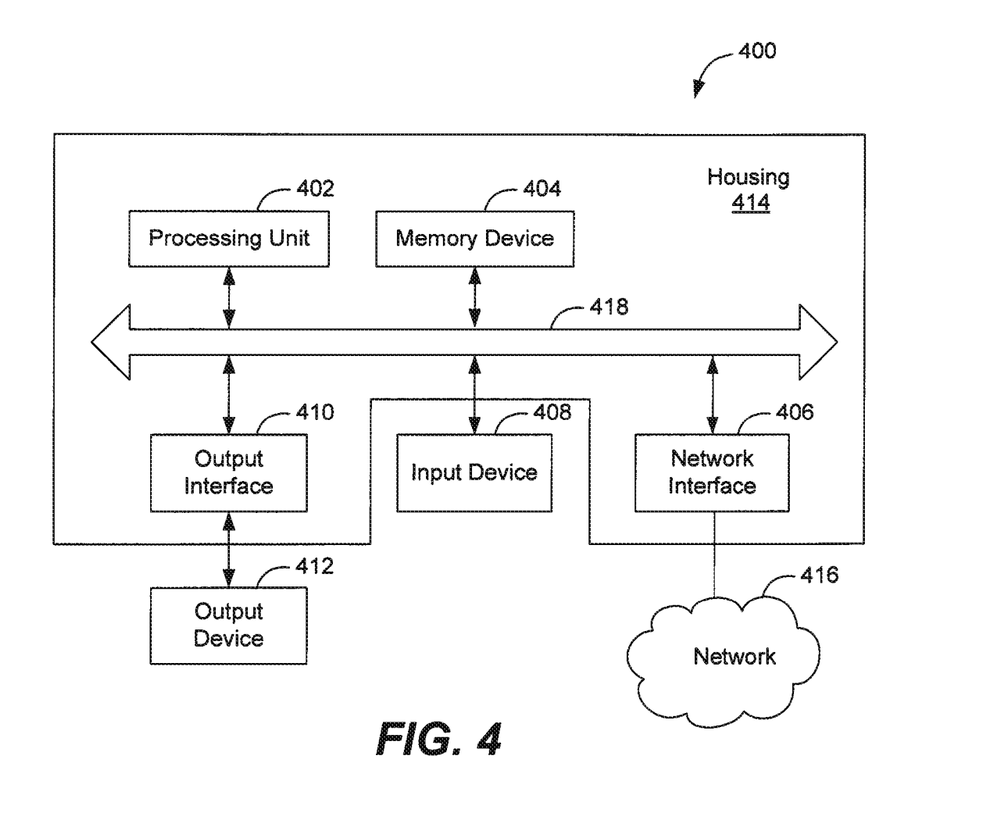
FIG. 4 is an exemplary block diagram of a system for designing and generating configuration data to configure a programmable logic device in accordance with one embodiment of the present invention.

With reference to FIG. 4, a system 400 may be used for designing and configuring PLD 102. System 400 may include a processing unit 402, a memory device 404, a network interface 406, an input device 408, an output interface 410, and an output device 412. The combination of processing unit 402, memory device 404, network interface 406, input device 408, output interface 410, and output device 412 is an example of host 104. Network interface 406, output interface 410, memory device 404, and processing unit 402 may be located within a housing 414 of system 400.

Processing unit 402 may be a central processing unit (CPU), a microprocessor, a floating point coprocessor, a graphics coprocessor, a hardware controller, a microcontroller, a PLD programmed for use as a controller, or a network controller. Memory device 404 may be a RAM, a read-only memory (ROM), or a combination of RAM and ROM. For example, memory device 404 may include a computer-readable medium, such as a floppy disk, a ZIP™ disk, a magnetic disk, a hard disk, a compact disc-ROM (CD-ROM), a recordable CD, a digital video disc (DVD), or a flash memory. Memory device 404 stores a program code for performing the methods, described herein, for designing and configuring PLD 102.

Network interface 406 may be a modem or a network interface card (NIC) that allows processing unit 402 to communicate with a network 416, such as a wide area network (WAN) or a local area network (LAN). Processing unit 402 may be connected via a wireless connection or a wired connection to network 416. Examples of the wireless connection include a connection using Wi-Fi protocol or a WiMax protocol. The Wi-Fi protocol may be an IEEE 802.11, IEEE 802.11a, IEEE 802.11b, IEEE 802.11 g, or IEEE 802.11i protocol. Examples of input device 408 include a mouse, a keyboard, a stylus, or a keypad.

Output device 412 may be a liquid crystal display (LCD) device, a plasma display device, a light emitting diode (LED) display device, or a cathode ray tube (CRT) display device. Examples of output interface 410 include a video controller that drives output device 412 to display one or more images based on instructions received from processing unit 402. Processing unit 402, memory device 404, network interface 406, input device 408, output interface 410, and output device 412 communicate with each other via a communication bus 418. In various embodiments, system 400 may not include input device 408 and/or network interface 406. Processing unit 402 may access the program code from memory device 404 or from a remote memory device (not shown) via network 416, to execute the program code.

Figure 5:
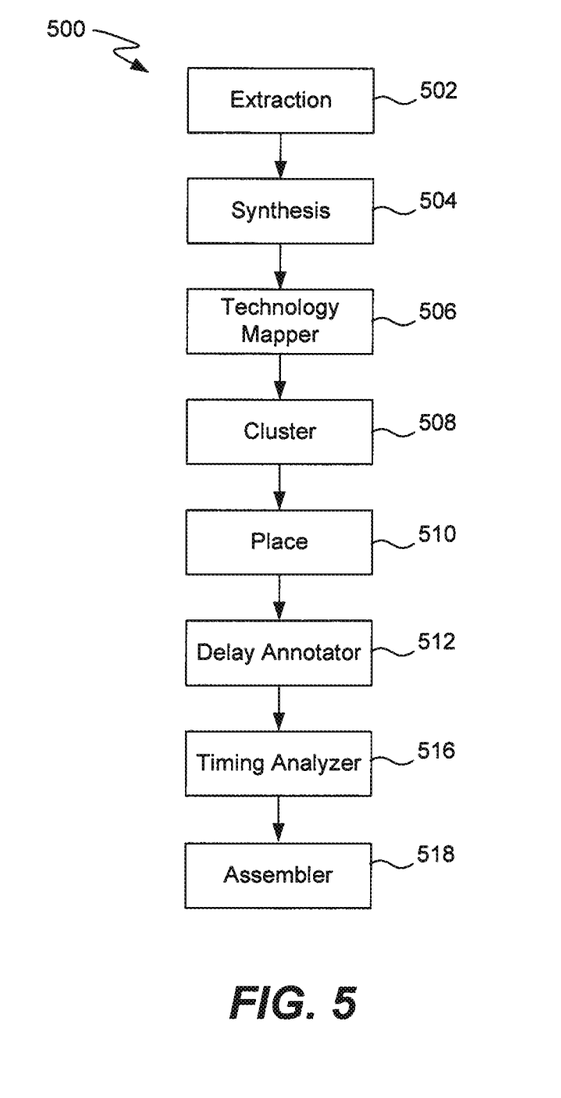
FIG. 5 is an exemplary block diagram of a compilation method used to generate the configuration data in accordance with one embodiment of the present invention.

Referring to FIG. 5, a compilation method 500 may include an extract phase 502, a synthesis phase 504, a technology mapping phase 506, a cluster phase 508, a place phase 510, a route phase 512, a delay annotator phase 514, a timing analysis phase 516, and an assembler phase 518. Processing unit 402 may access the program code for performing compilation method 500 stored within memory device 404 or the remote memory device, to execute the method 500.

Processing unit 402 may execute the compilation method 500 to convert a user design expressed, for example, as a Hardware Description Language (HDL) by the user, into configuration data used to configure PLD 102 to implement the user design. Processing unit 402 may execute extract phase 502 to convert the user design into a register transfer layer (RTL) description.

Processing unit 402 may execute synthesis phase 504 to convert the RTL description into a set of logic gates. Processing unit 402 may execute technology mapping phase 506 to map the set of logic gates into a set of atoms, which are irreducible constituents of the user design. The atoms may correspond to groups of logic gates and other components of the user design matching the capabilities of LEs or other portions of PLD 102.

Processing unit 402 may further execute cluster phase 508 to group related atoms together into clusters. Processing unit 402 may also execute place phase 510 to assign clusters of atoms to locations on PLD 102. Processing unit 402 may execute route phase 512 to determine a configuration of multiple configurable switching circuits of PLD 102 used to connect the atoms. Processing unit 402 may execute delay annotator phase 514 to determine multiple signal delays, such as data delays, for the set of atoms and their associated connections in the configurable switching circuits by using a timing model of PLD 102. Processing unit 402 may execute timing analysis phase 516 to determine whether the implementation of the user design in PLD 102 will meet multiple long-path and short-path timing constraints.

Processing unit 402 may execute assembler phase 518 to generate the configuration data specifying configuration of PLD 102 including the configuration of each LE and the configuration of the configurable switching circuit used to connect the LEs. Processing unit 402 may execute assembler phase 518 to write the configuration data to a configuration file, which can be stored within memory device 404. Processing unit 402 may access the configuration file to configure PLD 102 in order to implement instances of the user design.

Although the foregoing systems and methods have been described in detail by way of illustration and example for purposes of clarity and understanding, it will be recognized that the above described systems and methods may be embodied in numerous other specific variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A method comprising:
   configuring a first portion of an integrated circuit programmable logic device (PLD) with configuration data, the PLD comprising an array of programmable logic array blocks, a sequencer and a configuration bus; and
   operating the first portion before configuring a second portion of the programmable logic device; and
   subsequent to operating the first portion, configuring a second portion of the PLD; wherein:
      the first portion of the PLD includes a first respective subset of the array of programmable logic array blocks,
      the second portion of the PLD includes a second respective subset of the array of programmable logic array blocks; and
      one or both of configuring the first portion and configuring the second portion comprises sending, in an order controlled by the sequencer, configuration data via the configuration bus.

2. The method of claim 1, wherein said operating is performed when the programmable logic device is implemented in a first field of application, said method further comprising operating the second portion before reconfiguring the first portion when the programmable logic device is implemented in a second field of application.

3. The method of claim 1, wherein the first portion comprises a soft portion or a hard portion.

4. The method of claim 1, wherein said configuring the first portion comprises waking up the first portion from a sleep mode.

5. The method of claim 1, further comprising re-executing said method by:
   reconfiguring the second portion; and
   operating the second portion before reconfiguring the first portion.

6. The method of claim 1, further comprising:
   receiving a determination that the operation of the first portion is more critical to timing that an operation of the second portion; and
   configuring the first portion before the second portion in response to determining that operation of the first portion is more critical to time than an operation of the second portion.

7. The method of claim 1, wherein the programmable logic device comprises a field programmable gate array (FPGA) or an application specific integrated circuit (ASIC).

8. A non-transitory computer-readable medium including computer code further including a plurality of instructions executed by a processor to perform a method comprising:
   configuring a first portion of an integrated circuit programmable logic device (PLD) with configuration data, the PLD comprising an array of programmable logic array blocks, a sequencer and a configuration bus; and operating the first portion before configuring a second portion of the programmable logic device; and subsequent to operating the first portion, configuring a second portion of the PLD; wherein:

the first portion of the PLD includes a first respective subset of the array of programmable logic array blocks, the second portion of the PLD includes a second respective subset of the array of programmable logic array blocks; and one or both of configuring the first portion and configuring the second portion comprises sending, in an order controlled by the sequencer, configuration data via the configuration bus.

9. The non-transitory computer-readable medium of claim 8, wherein said operating is performed when the programmable logic device is implemented in a first field of application, wherein the method further comprises operating the second portion before reconfiguring the first portion when the programmable logic device is implemented in a second field of application.

10. The non-transitory computer-readable medium of claim 8, wherein the first portion comprises a soft portion or a hard portion.

11. The non-transitory computer-readable medium of claim 8, wherein said configuring the first portion comprises waking up the first portion from a sleep mode.

12. The non-transitory computer-readable medium of claim 8, further comprising a plurality of instructions to re-execute the method by:

reconfiguring the second portion; and operating the second portion before reconfiguring the first portion.

13. The non-transitory computer-readable medium of claim 8, wherein the method further comprises:

receiving a determination that the operation of the first portion is more critical to timing that an operation of the second portion; and configuring the first portion before the second portion in response to determining that operation of the first portion is more critical to time than an operation of the second portion.

14. The non-transitory computer-readable medium of claim 8, wherein the programmable logic device comprises a field programmable gate array or an application specific integrated circuit.

15. An integrated circuit programmable logic device (PLD) comprising:

an array of programmable logic array blocks;

a sequencer;

a configuration bus;

a first portion configured with configuration data; and a second portion, wherein the first portion is operated before configuring the second portion;

the first portion of the PLD includes a first respective subset of the array of programmable logic array blocks, the second portion of the PLD includes a second respective subset of the array of programmable logic array blocks; and one or both of the first portion and the second portion is configured by sending, in an order controlled by the sequencer, configuration data via the configuration bus.

16. The programmable logic device of claim 15, wherein the sequencer is a programmable sequencer.

17. The programmable logic device of claim 16, wherein the programmable sequencer is operable to control a configuration order of the first portion and the second portion.

18. The programmable logic device of claim 16 wherein either of the first portion and the second portion, once configured, can drive configuration of a subsequent portion.

19. The programmable logic device of claim 15, wherein the first portion comprises a soft logic block or a hard logic block and the second portion comprises a soft logic block or a hard logic block.

20. The programmable logic device of claim 15, wherein the programmable logic device comprises a field programmable gate array or an application specific integrated circuit.

* * * * *